(12) United States Patent
Algots et al.

(10) Patent No.: US 6,192,064 B1
(45) Date of Patent: Feb. 20, 2001

(54) NARROW BAND LASER WITH FINE WAVELENGTH CONTROL

(75) Inventors: John M. Algots; Christopher A. Marchi, both of San Diego; Frederick G. Erie, Oceanside; Jesse D. Buck, San Marcos; Alexander I. Ershov, San Diego; Palash P. Das, Vista; Igor V. Fomenkov, San Diego, all of CA (US)

(73) Assignee: Cymer, Inc., San Diego, CA (US)

( * ) Notice: Under 35 U.S.C. 154(b), the term of this patent shall be extended for 0 days.

(21) Appl. No.: 09/470,724

(22) Filed: Dec. 22, 1999

Related U.S. Application Data

(63) Continuation-in-part of application No. 09/390,579, filed on Sep. 3, 1999, which is a continuation-in-part of application No. 09/248,466, filed on Feb. 11, 1999, now Pat. No. 6,094,448, which is a continuation-in-part of application No. 08/886,715, filed on Jul. 1, 1997, now Pat. No. 5,970,082.

(51) Int. Cl.$^7$ ........................................................ H01S 3/08
(52) U.S. Cl. ................................ 372/99; 372/20; 372/98; 372/100; 372/102; 372/107; 372/57
(58) Field of Search .................................. 372/20, 32, 57, 372/58, 98–100, 102, 107, 108

(56) References Cited

U.S. PATENT DOCUMENTS

| | | | |
|---|---|---|---|
| 4,951,285 | * | 8/1990 | Cole et al. ............................. 372/20 |
| 4,991,178 | * | 2/1991 | Wami et al. ........................... 372/20 |
| 5,095,492 | * | 3/1992 | Sandstrom ........................... 372/102 |
| 5,249,192 | * | 9/1993 | Kuizenga et al. .................... 372/20 |
| 5,856,991 | * | 1/1999 | Ershov .................................. 372/20 |

* cited by examiner

Primary Examiner—Hemang Sanghavi
(74) Attorney, Agent, or Firm—John R. Ross, Esq.

(57) ABSTRACT

A smart laser having automatic computer control of pulse energy, wavelength and bandwidth using feedback signals from a wavemeter. Pulse energy is controlled by controlling discharge voltage. Wavelength is controlled by very fine and rapid positioning of an $R_{MAX}$ mirror in a line narrowing module. Bandwidth is controller by adjusting the curvature of a grating in the line narrowing module. Preferred embodiments include automatic feedback control of horizontal and vertical beam profile by automatic adjustment of a prism plate on which beam expander prisms are located and automatic adjustment of the $R_{MAX}$ tilt. Other preferred embodiments include automatic adjustment of the horizontal position of the laser chamber within the resonance cavity. In preferred embodiments, feedback signals from a wavelength monitor are used to position the $R_{MAX}$ mirror. In other preferred embodiments a separate laser beam reflected off the $R_{MAX}$ mirror on to a photodiode array is used to position the mirror.

19 Claims, 12 Drawing Sheets

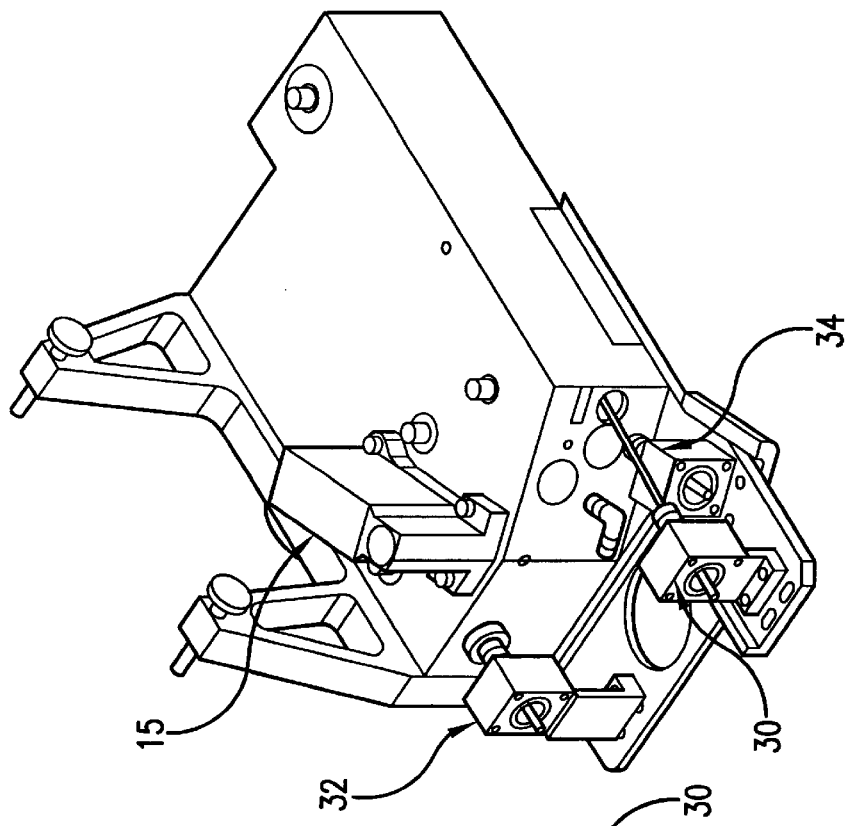
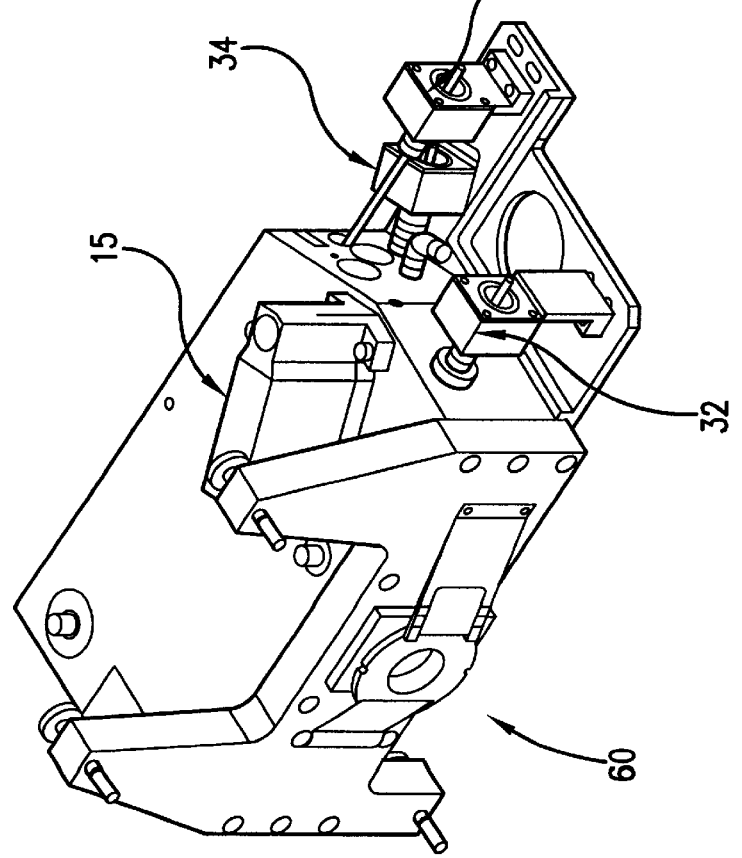
FIG.7B
FIG.7A

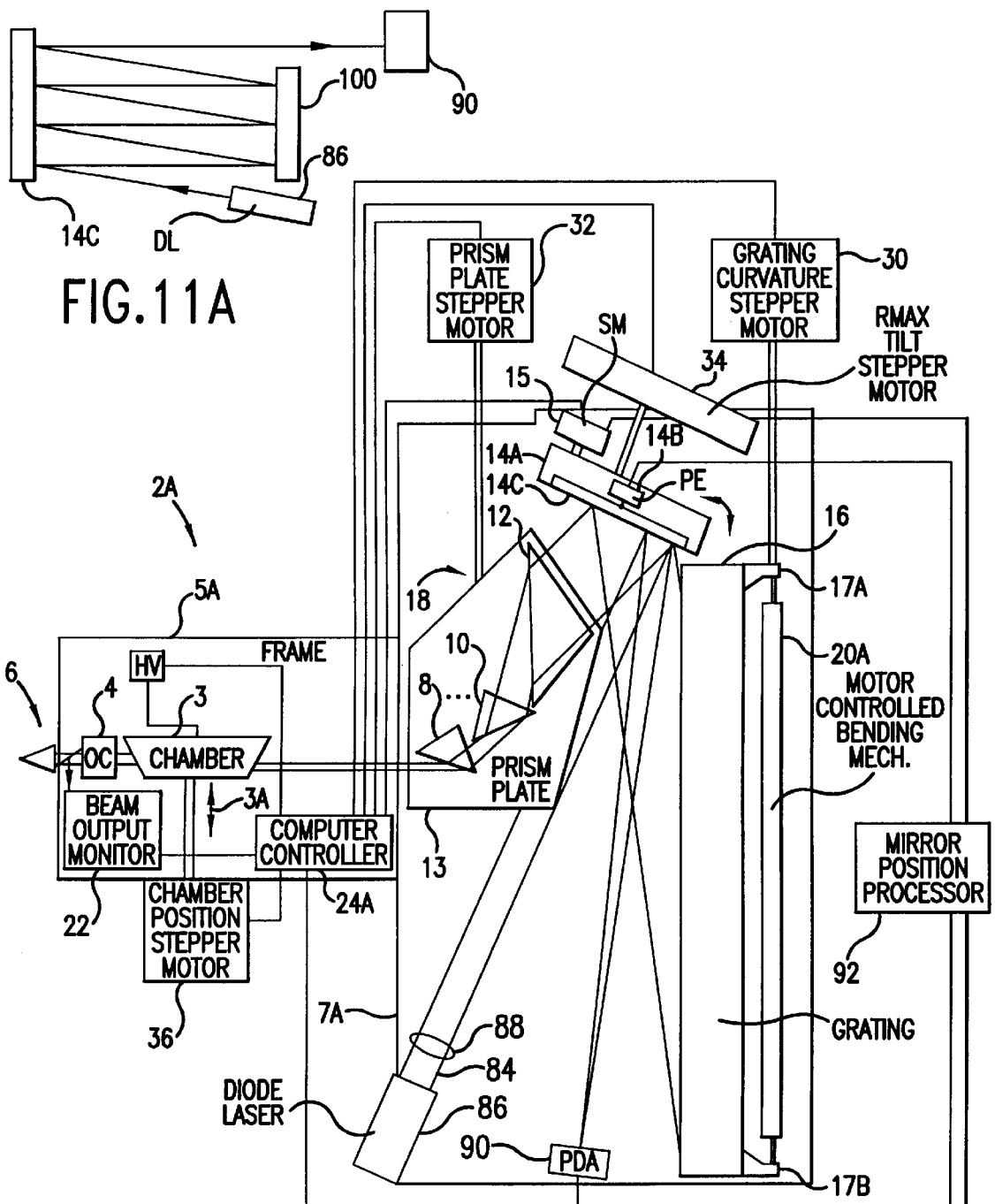

NARROW BAND LASER WITH FINE WAVELENGTH CONTROL

This is a continuation-in-part application of Ser. No. 09/390,579; filed Sep. 3, 1999 which is a continuation-in-part of Ser. No. 09/248,466 filed Feb. 11, 1999, now Pat. No. 6,094,448 which is a continuation-in-part of Ser. No. 08/886,715 filed Jul. 1, 1997, now Pat. No. 5,970,082. This invention relates to lasers and in particular to lasers with feedback control of beam quality.

BACKGROUND OF THE INVENTION

In many laser applications precise control of beam output is desired. One such application for such lasers is the light source for integrated circuit lithography. Currently the KrF excimer laser is the choice light source for state of the art integrated circuit lithography devices. Specifications for the light source are becoming tighter as efforts are made to increase production and produce finer integrated circuit patterns.

Typical specifications for a 248 nm KrF laser call for bandwidths of about 0.6 pm full width half maximum, wavelength stability within 0.1 pm of the specified wavelength and energy dose stability of about ±0.5 percent. In addition, control of beam cross section intensity values are important.

FIG. 1 shows some of the features of a prior art KrF excimer laser system used for IC lithography. The system includes a laser frame structure 5 within which is mounted a laser chamber 3 containing two elongated electrodes (not shown) between which is a gain medium, a line narrowing module (referred to as a "line narrowing package" or LNP) 7 shown disproportionately large and an output coupler 4. The LNP portion of FIG. 1 represents a top view of the LNP. The beam cross section is generally rectangular, typically about 3.5 mm wide and 15 mm high. In prior art devices each of the line narrowing module 7 and the output coupler module 4 (typically comprising a partially reflecting mirror) comprise frames which are fixedly mounted to laser frame structure 5. Optical components within the frames of the output coupler module and the line narrowing module are adjusted manually to define the laser resonance cavity. The chamber is adjustably mounted within the laser frame so that it can be finely positioned manually within the defined resonance cavity from time to time in the direction of the beam width as shown by arrows 3A on FIG. 1. These adjustments permit a laser technician to align the resonance cavity with the gain medium in order to achieve optimum beam output parameters. In this prior art embodimet, for example, a prism beam expander 18 is comprised of prisms 8, 10 and 12 mounted on prism plate 13. In the prior art device, prism plate 13 can be manually adjusted in the direction of arrows 13A as an alignment technique. The prior art device also includes a manual adjustment of the curvature of the surface of grating 16 into an increasingly or decreasingly concave shape by expanding or contracting bending mechanism 20 to place larger or smaller compressive forces on legs 17A and 17B. The adjustment is done primarily to control bandwidth of the output beam. Another prior art technique for forcing a concave shape on the grating surface is described in U.S. Pat. No. 5,095,492.

Typical prior art lithography excimer lasers now in use incorporate two automatic feedback controls to regulate pulse energy and nominal wavelength. Pulse energy is controlled in a feedback system by measuring the output pulse energy with a beam output monitor 22 as shown in FIG. 1 and then using these measurements with a computer controller 24 to control the high voltage applied between the electrodes in order to regulate pulse energy within desired limits. The beam output monitor 22 (also called a wavemeter) also measures the nominal wavelength and bandwidth of the pulsed output beam. Computer controller 24 adjusts the pivot position of tuning mirror 14 using stepper motor 15 in order to control the nominal wavelength of the beam to within desired limits.

In prior art devices stepper motor 15 can be stepped in increments as small as 1 µm. A lever linkage de-magnifies these steps by a factor of 26 to reduce the size of the step to 38 nm. These linear steps provide pivot movement to tuning mirror 15 about pivot line 17 so that each minimum linear step of stepper motor produces a pivot action of mirror 14 of about 0.47 microradians. From experience a pivot of 0.47 microradian produces a change in the laser nominal wavelength of about 0.05 pm.

What is needed are improvements which will provide easier, faster and more precise control of laser beam output parameters.

SUMMARY OF THE INVENTION

The present invention provides a smart laser having automatic computer control of pulse energy, wavelength and bandwidth using feedback signals from a wavemeter. Pulse energy is controlled by controlling discharge voltage. Wavelength is controlled by very fine and rapid positioning of an $R_{MAX}$ mirror in a line narrowing module. Bandwidth is controller by adjusting the curvature of a grating in the line narrowing module. Preferred embodiments include automatic feedback control of horizontal and vertical beam profile by automatic adjustment of a prism plate on which beam expander prisms are located and automatic adjustment of the $R_{MAX}$ tilt. Other preferred embodiments include automatic adjustment of the horizontal position of the laser chamber within the resonance cavity. In preferred embodiments, feedback signals from a wavelength monitor are used to position the $R_{MAX}$ mirror. In other preferred embodiments a separate laser beam reflected off the $R_{MAX}$ mirror on to a photodiode array is used to position the mirror.

BRIEF DESCRIPTION OF THE DRAWINGS

FIGS. 7A and B show bottom prospective views of the line narrowing module of the FIG. 2 embodiment.

FIGS. 11, 11A and 11B show features of another preferred embodiment.

DETAILED DESCRIPTION OF THE PREFERRED EMBODIMENTS

Preferred embodiments of the present invention can be described by reference to the drawings.

First Preferred Embodiment

Figure 2:
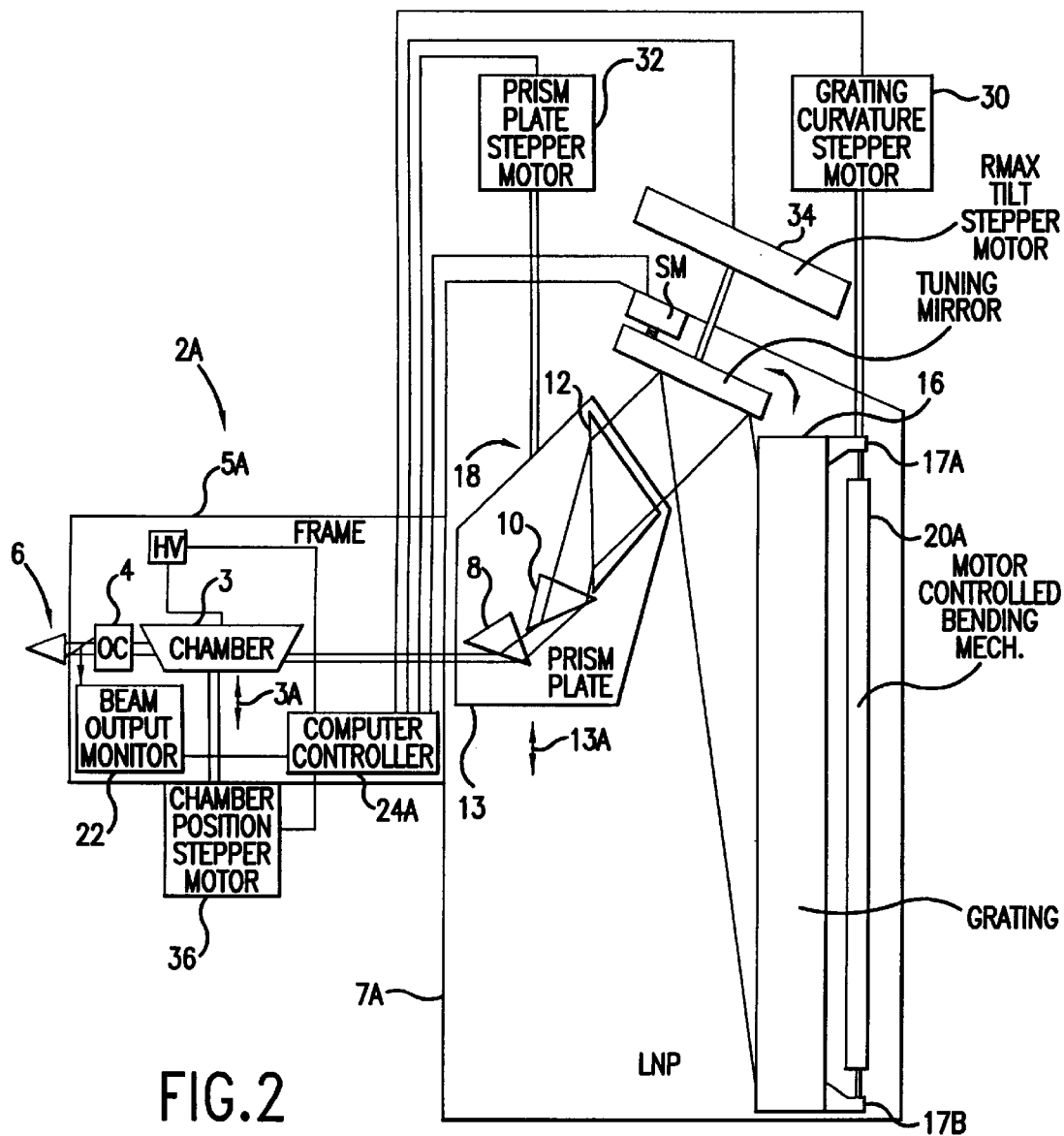
FIG. 2 shows a preferred embodiment of the present invention.

A combination block diagram schematic drawing of a first preferred embodiment of the present invention is shown in FIG. 2. This drawing shows important improvements over the prior art which automate the alignment of the laser chamber and components in order to provide greatly improved instant control of the important laser beam parameters. The new laser frame 5A has added on to it a chamber position stepper motor to automatically adjust the horizontal position of the chamber in the direction 3A. The new LNP 7A includes a prism plate stepper motor 32, an R-max tilt stepper motor 34 and a grating curvature motor 30. All of these stepper motors are controlled by computer controller 24A.

Two-Way Automatic Control of Grating Surface Curvature

A grating curvature stepper motor 30 has been added to control the curvature of grating 16. The system includes a new bending mechanism design 20A which has the capacity to apply either a compressive force to spread apart legs 17A and 17B to create a concave curvature in the lined surface of grating 16 or a tension force to pull together legs 17A and 17B to create a convex curvature in the lined surface of grating 16. Control of motor 30 is provided by computer controller 24.

Figure 3A:
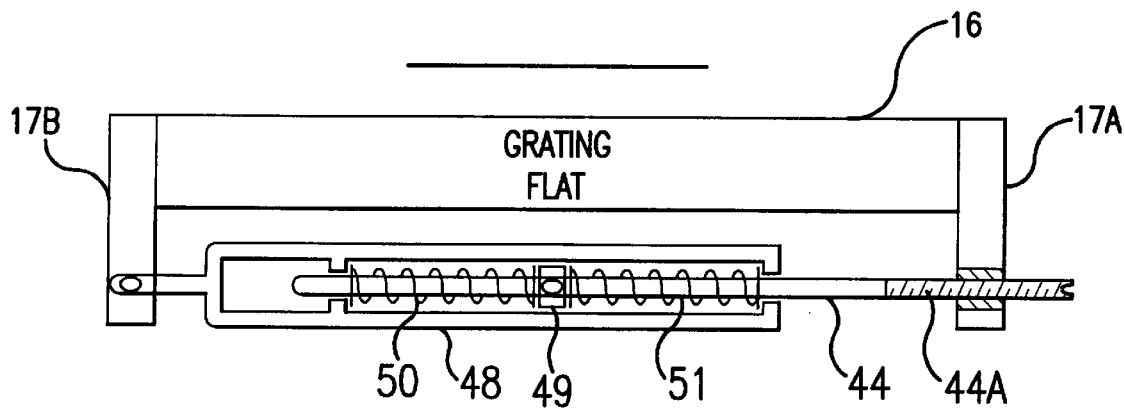
FIGS. 3A, B and C show the operational principals of a grating bending
Figure 3B:
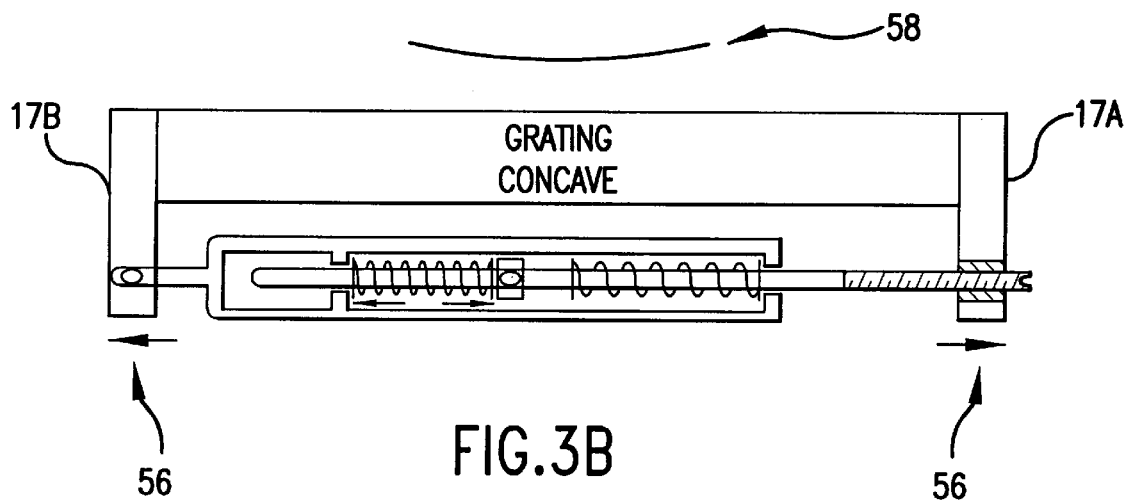
Figure 3C:
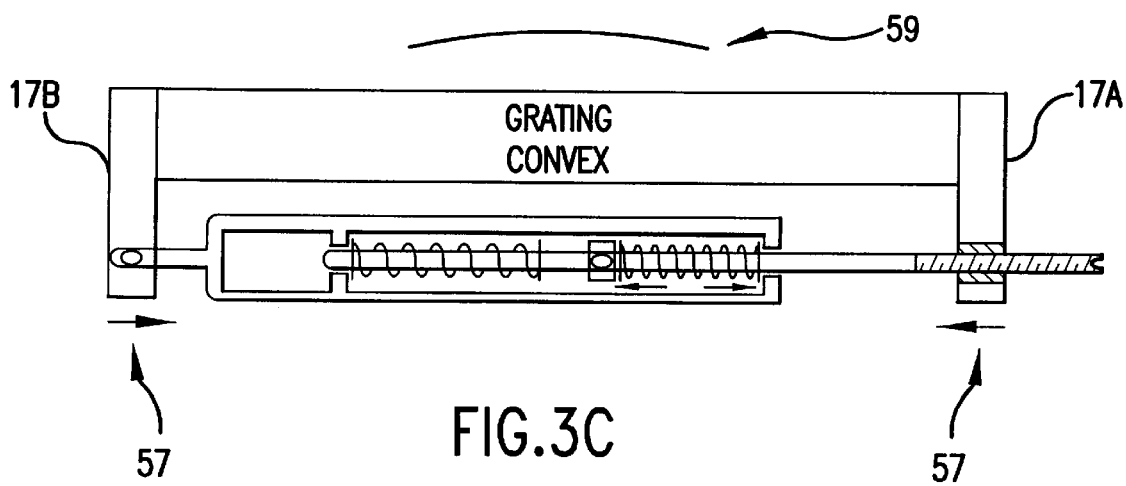

The basic elements and a functional description of the operation of the grating bending mechanism is shown in FIGS. 3A, 3B and 3C. FIG. 3A shows a grating assembly having a bidirectional control unit attached to it but with no bending force applied to the grating. Shown are grating 16, left end plate 17B, right end plate 17A, compression spring housing 48, left compression spring 50, right compression spring 51, adjustment shaft 44 and piston 49 which is fixedly pinned to adjustment shaft 44. Adjustment shaft 44 comprises threaded length 44A (¼–28 UNF-2B×1.38 long) which mates with threaded channel in right end plate 17A. In the FIG. 3A condition, both springs are applying equal compressive force which offset each other or both springs may be unloaded. The curvature of the grating surface is adjusted by turning shaft 44. By screwing shaft 44 into housing 48, left compression spring 50 is compressed against the left side of housing 48 and piston 49 as shown by the two arrows inside housing 48 in FIG. 3B. The compression force pushes rod 44 to the right and housing 48 to the left which has the effect of pushing apart the two end plates 17A and 17B as shown by arrows 56. This has the effect of bending the surface of grating 1 into a concave shape as shown by line 58.

Conversely, by screwing shaft 44 in a direction to drive rod 44 out of housing 48, right compression spring 51 is compressed against the right side of housing 48 and piston 49 as shown by the two arrows inside housing 48 in FIG. 3C. The compressive force pulls rod 44 to the left and pulls housing 48 to the right which has the effect of pulling end plates 17A and 17B together as shown by arrows 57. This has the effect of bending the surface of grating 1 into a convex shape as shown by line 59.

In this preferred embodiment rod 44 has 28 threads per inch and the springs are rated at 52 pounds per inch. Operators are able with this design to make extremely fine adjustments to the curvature of the grating surface.

Figure 4:
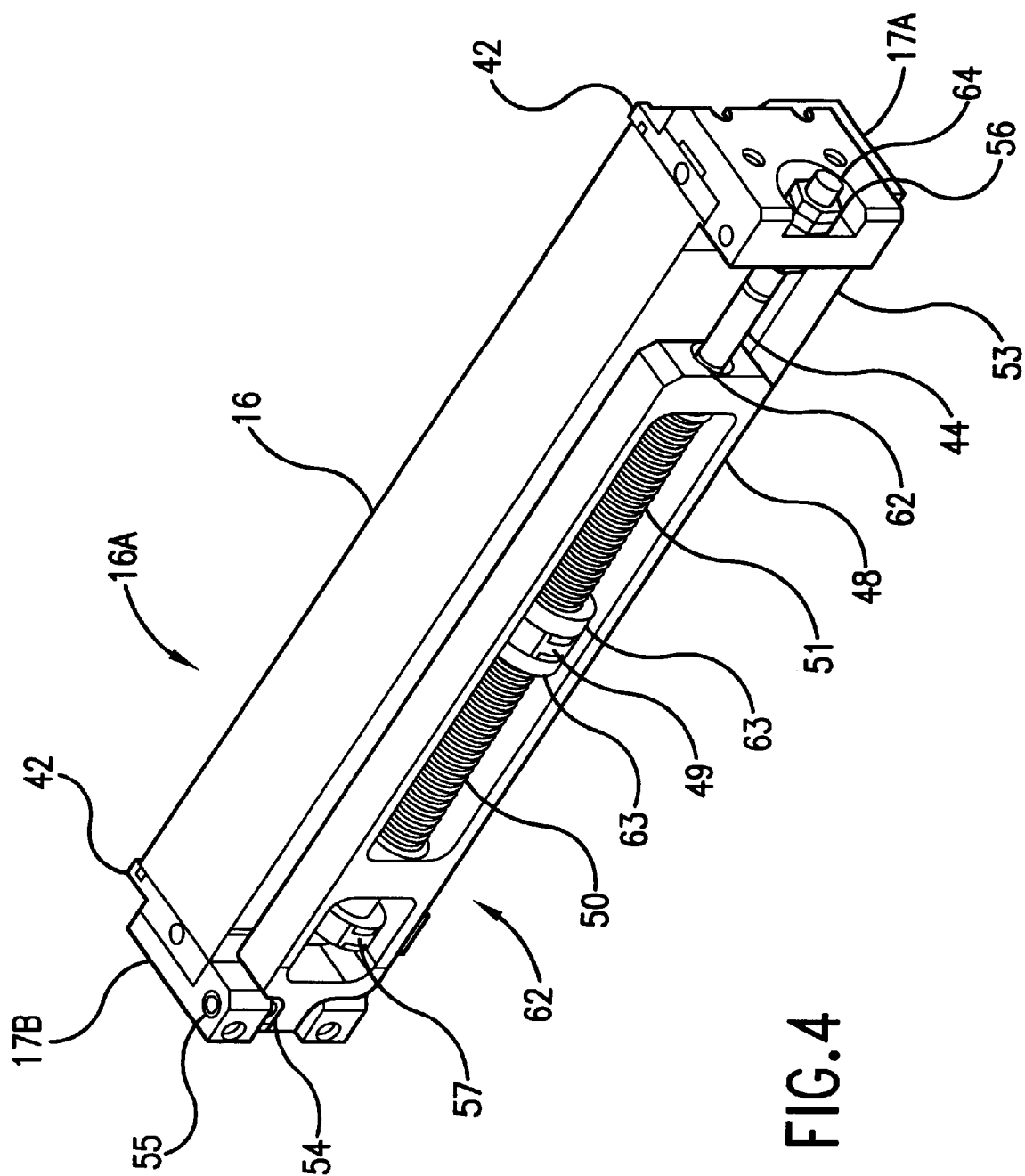
FIG. 4 shows a prospective view of the bending mechanism.

FIG. 4 is a perspective view of a grating assembly 16A fabricated by Applicants and their co-workers. The assembly is comprised of grating 16, two grating end plates 42 (bonded to grating 16) right bidirectional bandwidth control end plate 17A, lock nut 56, invar base plate 53 bonded to grating 16, alignment rod 44, socket 64, two linear bearings 62, compression spring housing 48, right compression spring 51, two thrust bearings 63, piston 49 pinned to rod 44, left compression spring 50, travel limiting piston 57 pinned to rod 44, radial ball bearing 54, pivot shaft 55 and left bandwidth control end plate 17B.

Figure 5:
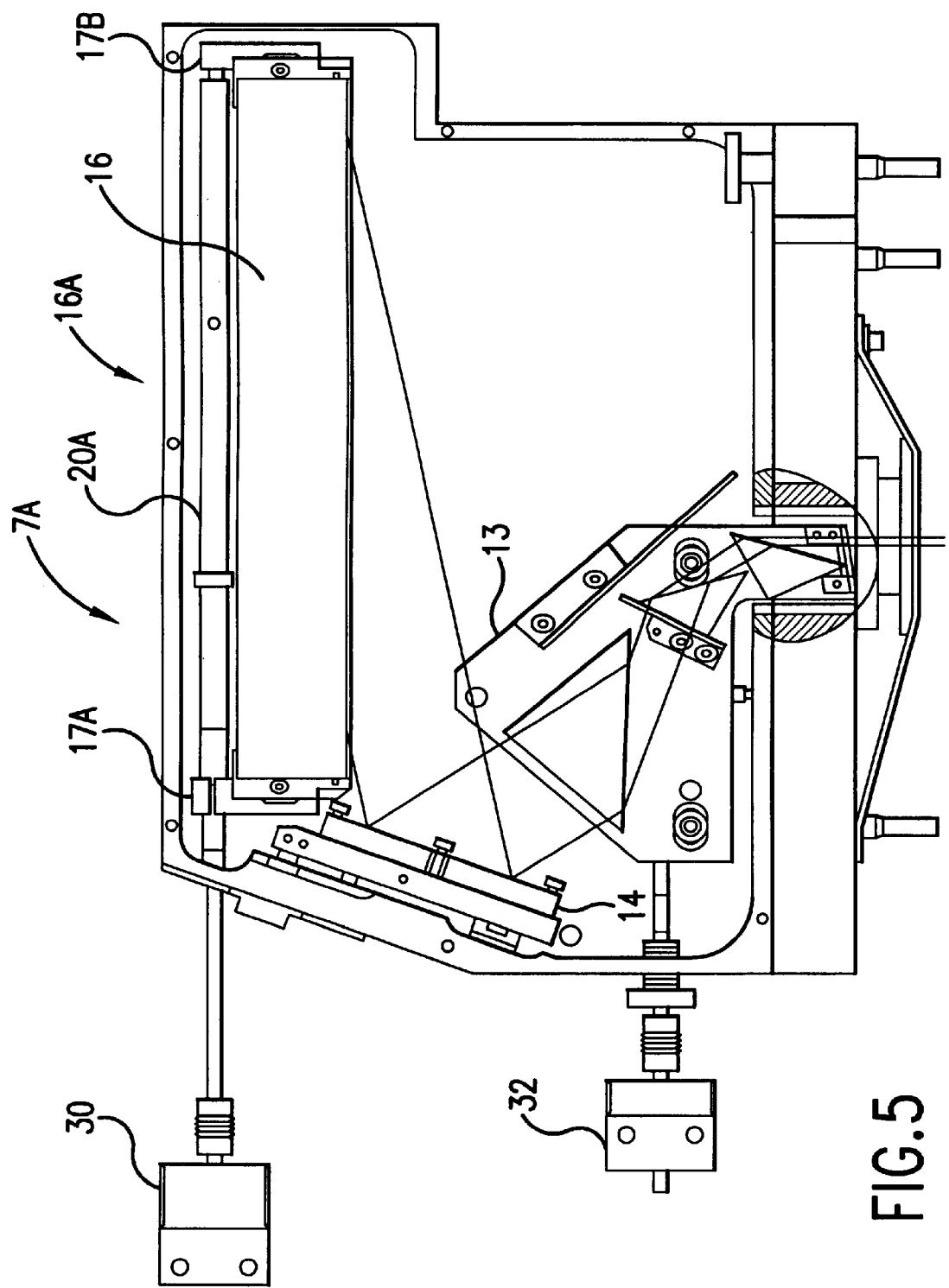
FIG. 5 shows some of the features of the FIG. 2 preferred embodiment.

FIG. 5 is a cutaway drawing of LNP 7A. It shows the two-way curvature-controlled grating assembly 16A. Also shown is grating curvature control stepper motor 30 for controlling the curvature of the lined surface of grating 16 from concave to convex as explained above with reference to FIGS. 3A, 3B and 3C. FIG. 5 also shows prism plate adjustment motor 32. Motor controls for $R_{MAX}$ mirror 14 are not shown in FIG. 5.

Bottom views of line narrowing package 7A are shown in FIG. 7A (from the front, i.e., looking from the laser toward the LNP) and in FIG. 7B (from the rear). Grating curvature stepper motor 30 is shown mounted on its mounting plate. Prism plate motor is shown at 32 and $R_{MAX}$ tilt motor is shown at 34 and $R_{MAX}$ stepper tuning motor is shown at 15. The $R_{MAX}$ stepper tuning mechanism in this embodiment is substantially identical to a prior art mechanism discussed in the background section. A lever mechanism de-magnifies the linear stepper drive by a factor of 26 to provide for 0.038 micron minimum steps. The beam entrance-exit port for the LNP is shown at 60.

Prism Plate Position Control

Position control of prism plate 13 is depicted in cutaway drawing 5A which also shows prism plate stepper motor 32. Stepper motor 32 is also shown in FIGS. 7A and 7B mounted on its mounting plate. Control of motor 32 is provided by computer controller 24.

Figure 6D:
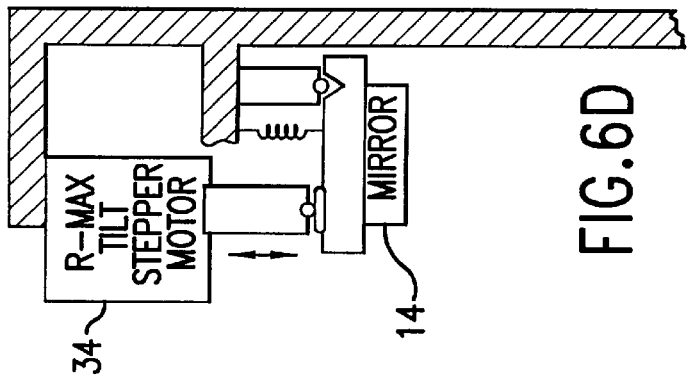
FIGS. 6A, B, C and D show other features of the FIG. 2 embodiment.
Figure 6A:
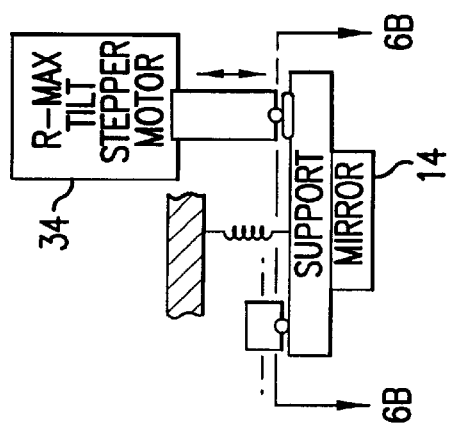
Figure 6B:
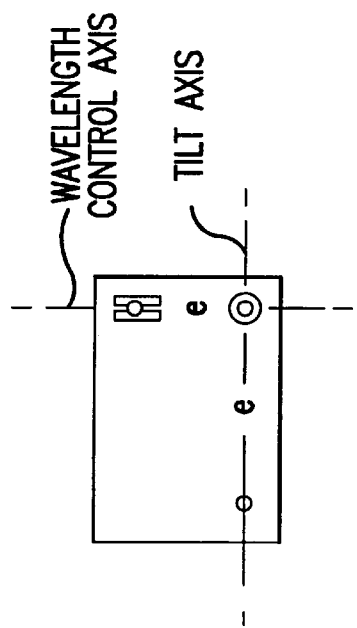
Figure 6C:
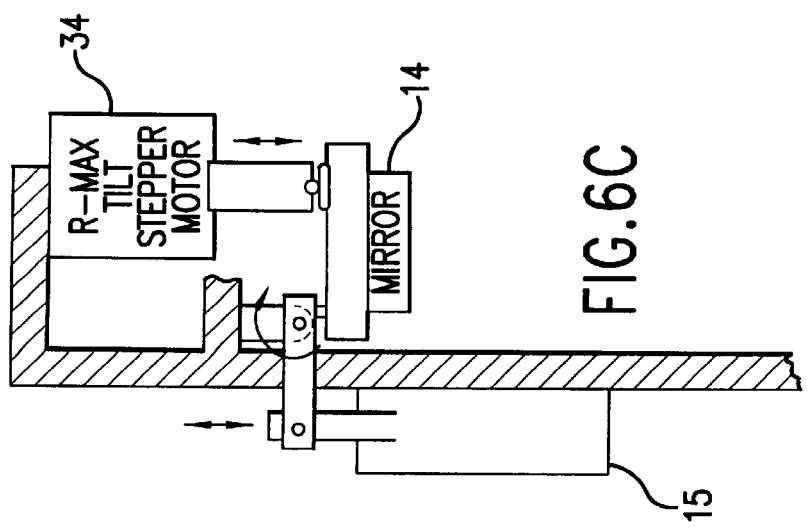

Automatic $R_{MAX}$ Tilt Control $R_{MAX}$ tilt control stepper motor is shown at 34 in FIGS. 7A and 7B and 6A, C and D. The tilt of $R_{MAX}$ mirror 14 is provided by $R_{MAX}$ stepper motor 34 which is also controlled by computer controller 24. The tilt of mirror 14 determines the vertical angle of light reflecting in the resonance cavity.

Wavelength Selection with Tuning Mirror

In this preferred embodiment, wavelength selection is provided with stepper motor 15 setting the pivotal horizontal position of tuning mirror 14 based on direction from computer controller 24 which utilizes feedback wavelength information from wavemeter 22 in accordance with prior art techniques as discussed in the background section of this specification.

Automatic Chamber Position Control

This first preferred embodiment includes chamber position stepper motor 36 shown in FIG. 2 which automatically adjusts relative to frame 5 (on which is mounted output coupler 4 and line narrowing package 7) the horizontal position of laser chamber 3 (and thus the horizontal position of the gain medium contained therein) in the direction perpendicular to the direction of beam 6.

Controls

Computer controller 24A shown in FIG. 2 is preferably programmed with control algorithms which control motors 36, 32, 34, 30 in addition to 15 in order to maintain beam parameters within desired ranges based on feedback signals from wavemeter 22. A simple approach is to hold all positions constant except one (for example chamber position stepper motor) and scan that item over a predetermined range to seek the position producing the optimum beam performance looking at parameters such as pulse energy output, pulse energy stability and bandwidth. The computer can be programmed to make these scans on operator instruction or to do the scans on a predetermined periodic basis. The computer could also be programmed to make one or more of these types of scans, seeking optimum position, if wavemeter detects a deterioration of any beam quality.

Also during burst mode operation of the laser (where, for example, the laser is operated to produce bursts of pulses such as 300 pulses at a rate of 1000 pulses per second followed by a downtime of 0.3 seconds) beam parameters are known to vary as a function of pulse number (i.e., time after the start of the bursts). In order to moderate or compensate for these variations, the computer controller could be programmed to adjust one or more of the stepper motors as a function of time after the start of the bursts.

Specific Optimization Techniques

In one preferred performance optimization technique a figure of merit M is defined in order to judge optimum laser performance. Adjustments are then made to maximize the value of the figure of merit. This value is computed using input from sensors which measure the beam in real time. These sensors typically provide values such as energy stability, laser efficiency (energy out for voltage in), bandwidth, beam width, beam symmetry, pointing stability, etc. In general the best figure of merit will combine the several parameters which are most important for determining success in the application, such as lithography exposure. For example if only laser efficiency as measured by pulse energy/charging voltage (E) was considered important to the figure of merit would be
M=pulse energy/charging voltage, or
M=E
If spacial symmetry (in the horizontal direction), SH, is to be judged in addition E, then SH should be measured and given a weighting factor, $W_{SH}$. Perfect symmetry would be zero. The new formula for figure of merit would then be:

$$M=E-(W_{SH})(SH)$$

Adjustments would then be made to minimize M. Similarly the figure of merit M could be made a function of other parameters such as vertical symmetry (VS), bandwidth (B), wavelength stability (WS) and dose stability (DS). In this case the formula for M would be:

$$M=E-(W_{SH})(SH)-(W_{SV})(SV)-(W_B)(B)-(W_{WS})(WS)-(W_{DS})(DS)$$

Again, the computer is programmed to make adjustments to the stepper positions, measure E, SH, SV, B, WS and DS, apply weighting factors to achieve minimum figures of merit M.

Many techniques are well known for optimizing laser performance where several parameters of the type discussed above are considered. One preferred embodiment is the downhill simplex method which is documented in the book *Numerical Recipes, The Art of Scientific Computing* by W. H. Press, et al., Cambridge University Press 1990 and referenced therein. In brief, a group of initial settings is chosen for the adjustments. There will be a number of configurations (a configuraiton is a set of values for the adjustments) which is one greater than the number of parameters being adjusted. For one iteration, the adjustments are set to each configuration and the figure of merit is measured. The configuration with the worst merit is then rejected and replaced with a new configuration which is closer to the best configuration. As the iterations proceed, the configurations become closer to one another until any one of them may be chosen as the optimum. In early work, Applicants have found that about 10 iterations suffice to locate the optimum. The downhill simplex method is a reliable technique, however, if very rapid convergence is needed other well known techniques could be utilized.

Measurement of Additional Beam Parameters

As indicated in the background section, prior art lithography lasers are provided with a wavemeter which measures pulse energy wavelengths and bandwidth at rapid rates. Typically the parameters are measured for each laser pulse which may be at rates of 1000 Hz to 2000 Hz.

Figure 8:
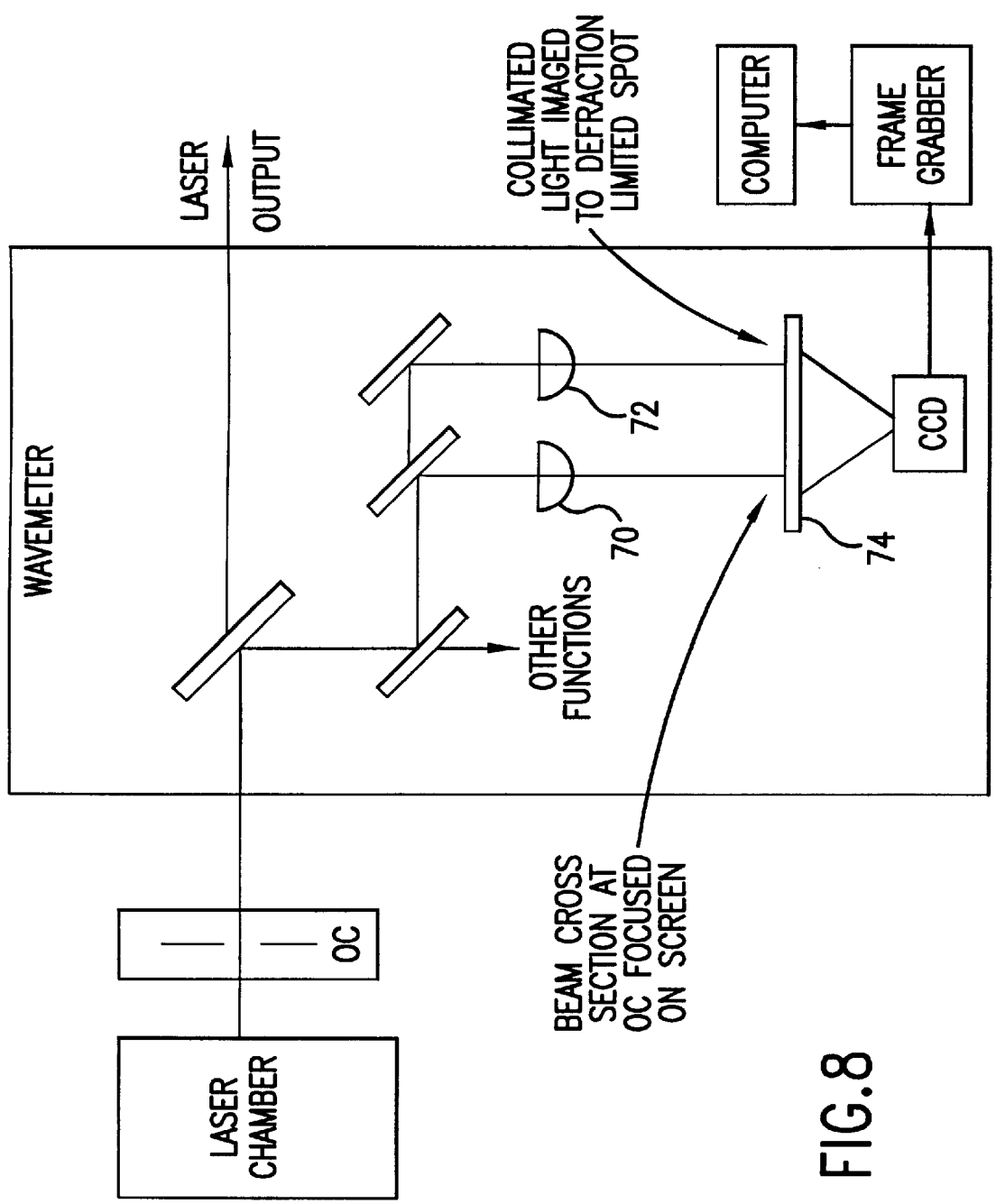
FIG. 8 shows an optical setup for measuring selected beam parameters.

In order to measure various beam parameters, Applicants provided the optical setup described in FIG. 8. An image of the laser beam at the output coupler aperture was relayed optically through lens 70 to a fluorescent screen and beam parameters including vertical and horizontal symmetry were determined utilizing a CCD camera focused on fluorescent screen 74 as shown in FIG. 8. The fluorescent screen converts the UV light from the laser to visible light which is monitored by the CCD camera. The analog output from the camera is converted to digital with a video frame grabber and the output of the frame grabber is analyzed by a computer processor.

Applicants in conjunction with this work were also able to monitor beam divergence, beam pointing and beam pointing stability with a second beam path through lens 72 as shown in FIG. 8. In this case, lens 72 focuses the laser beam onto the fluorescent screen 74 and is located so that perfectly colluminated light entering the lens would appear as a diffraction limited spot at the fluorescent screen. Therefore, the size of the spot is a measure of the divergence of the beam and movement of the spot is a measure of changes in beam pointing. These additional parameters could be used with the present invention to optimize laser performance taking into consideration these parameters.

Wavelength Control

The typical method of controlling wavelength in laser lithography is for the laser operator to specify a wavelength and the laser control system is set up to automatically produce the specified wavelength with a feedback program. This is usually desirable because during integrated circuit production the laser is typically operated in short bursts of pulses such as 100 pulses at a rate of 1000 pulses per second with downtimes between bursts of a fraction of a second to several seconds. The result is that the wavelength of the beam will fluctuate due to changes in the gain medium and the optical components of the laser system.

Figure 1:
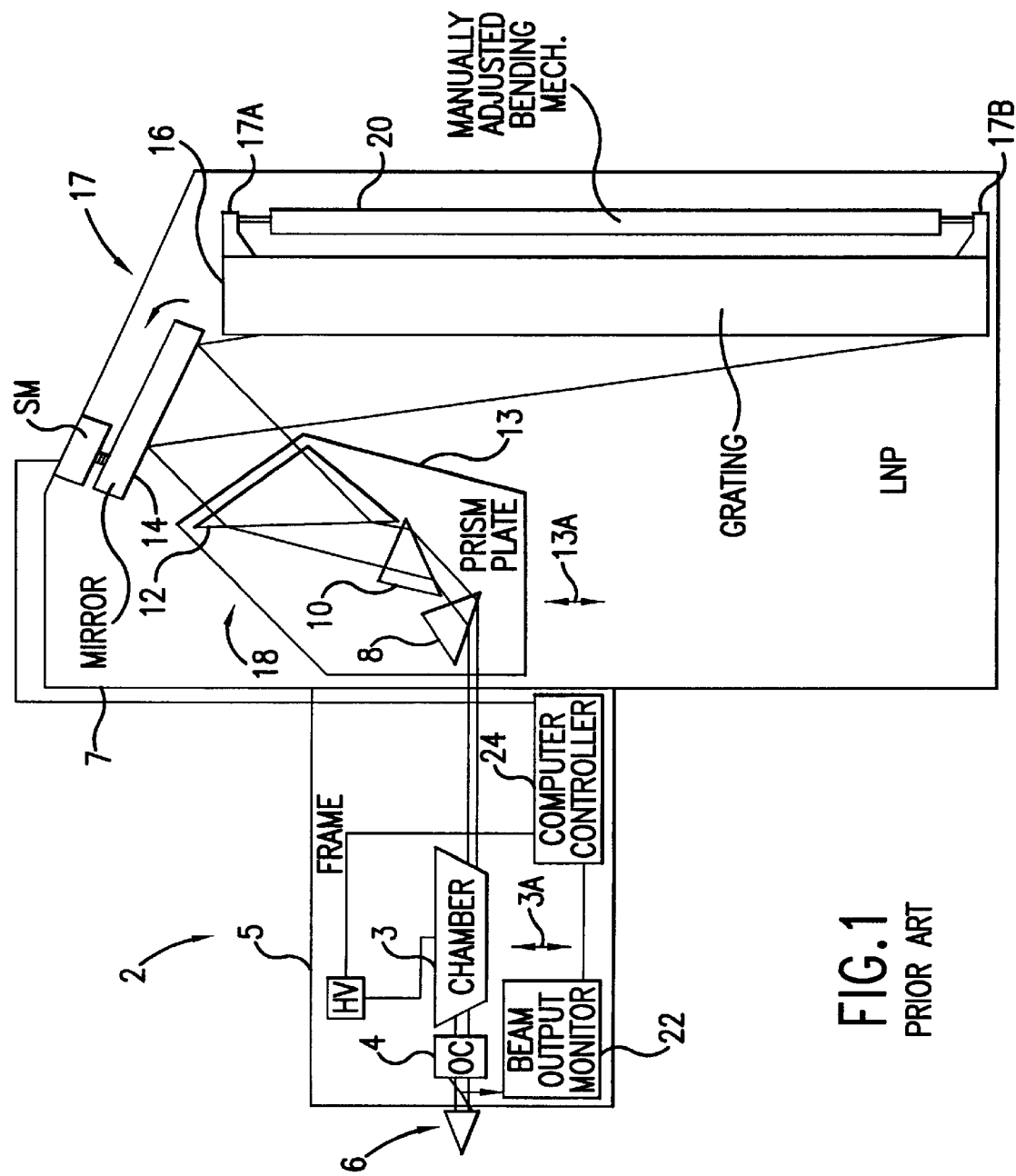
FIG. 1 shows a prior narrow band art laser configuration.

In the prior art lithography laser system as shown in FIG. 1, the wavelength of the laser output beam is monitored in output monitor 22 where a combination grating and etalon wavelength monitor monitors the wavelength to an accuracy of about 0.1 pm. The monitor is periodically calibrated against a known absorption line. Such a prior art wavemeter is described in U.S. Pat. No. 5,978,334 incorporated herein by reference. For example, the laser operator may program computer controller 24 to control the laser wavelength to 248,321.30 pm. Controller 24 receives wavelength measurements from monitor 22 and uses that information to adjust stepper motor 15 to pivot mirror 14 so that the wavelength is either increased or decreased to maintain the wavelength as measured by monitor 22 at the desisred wavelength of 248,321.30 pm. The smallest increment of movement of this prior art stepper motor 15 will change the output wavelength by about 0.05 pm.

Finer Wavelength Control

Figure 9:
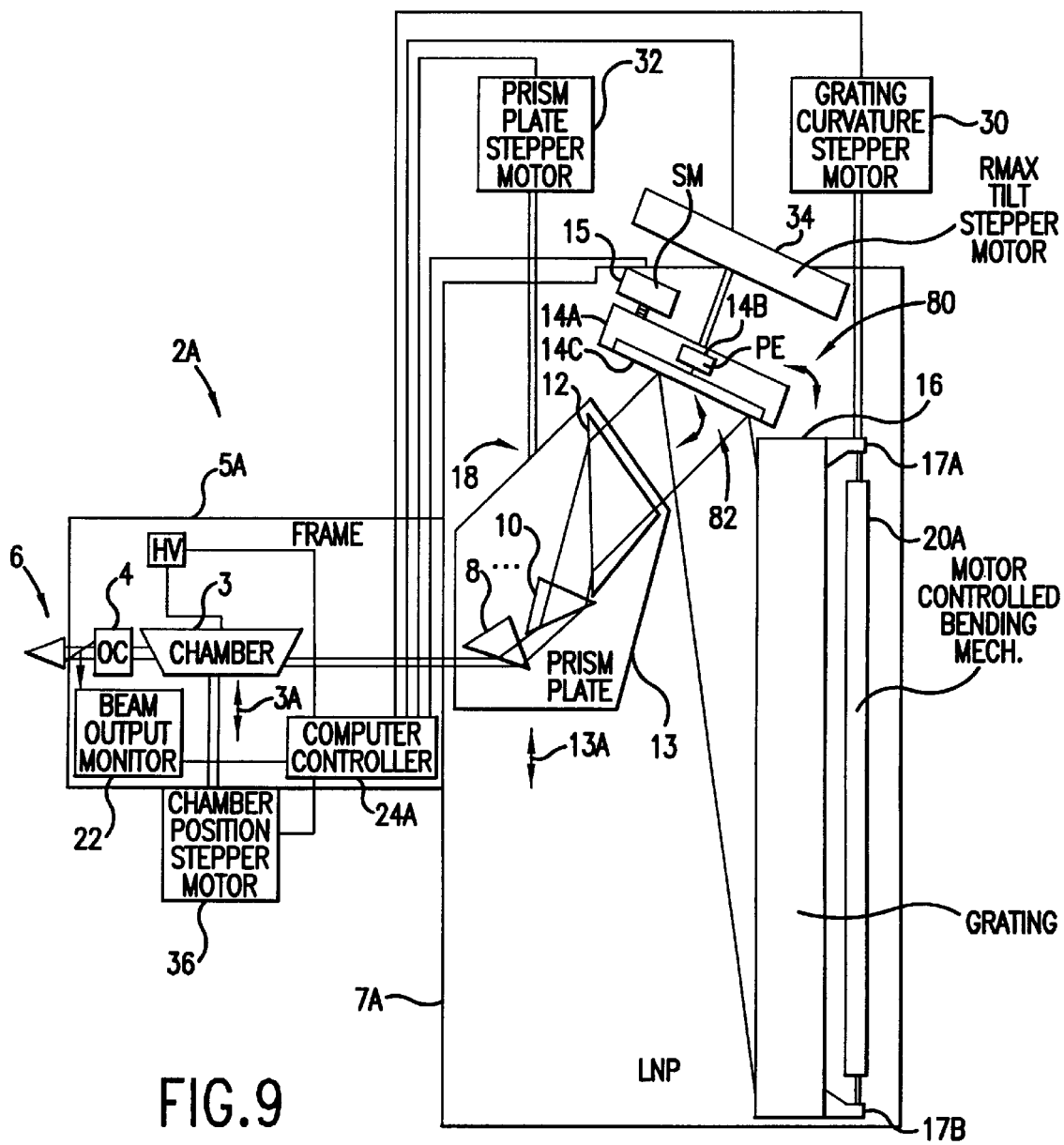
FIGS. 9 and 9A show features of preferred embodiments.

A preferred embodiment for providing finer wavelength control is shown in FIG. 9. In this embodiment, prior art stepper motor 15 is utilized to pivot mirror mechanism 14a (about a vertical pivot line as indicated at 80) which includes within it a piezo-electric actuator 14B configured to pivot tuning mirror 14C with one degree of rotary motion (about a vertical pivot line as indicated at 82). Mirror 14C has dimensions of about 1½ inch×3.0 inch and is about 2½ inch thick. It weighs about 2 ounces. Small piezo-electric actuators are available which can provide pivot range of 0.1 radians at rates of 5000 Hz with extremely fine precision from supplier such as Physik Instrument for mirrors of this size. These tuning mirror systems are provided with an electronic drive unit which provides high voltage signals to the piezo-electric motors.

In this preferred embodiment, computer controller 24A is programmed to control both stepper motor 15 and piezo-electric unit 14B. Piezo-electric actuator 14B can turn mirror 14C with extremely fine precision so that the laser can be tuned with much more accuracy than the accuracy of the wavemeter which is about 0.1 pm.

Figure 9A:
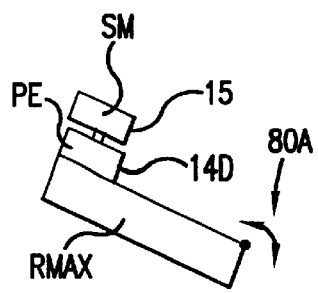

In another arrangement as shown in FIG. 9A, the piezo-electric actuator 14D is mounted in series with stepper motor 15 and applies the linear expansion and contraction of the piezo-electric drive to pivot the $R_{MAX}$ mirror about pivot line 80A.

Pre-Tuning

One problem with the prior art wavelength tuning arrangement is that it is a feedback system which means that a few pulses may be required before the laser controls can make the necessary adjustments to produce the wavelength desired. FIG. 11 shows an embodiment especially designed for tuning in advance of laser operation.

A parallel beam 84 from diode laser system 86 is reflected off mirror 14C and is focused by cylindrical lens 88 to a fine line on photo diode array 90 which is used to measure the pivot position of mirror 14C. Information from PDA 90 is used by mirror positioning processor 92 in a feedback configuration to control the positions of stepper motor 15 and piezo-electric actuator 14B to produce the degree of mirror pivot commanded by computer controller 24A. Computer controller 24A is programmed to establish a correlation matrix of PDA output data with wavelength so that it can call for the proper mirror position in advance to produce desired wavelength output.

Parallel beam 84 may be provided by diode laser system 86 comprising diode laser 94 working at 670 nm coupled to a single-mode fiber 96 with a core diameter of about 2.5 micron. Light exiting fiber 96 is collimated by an aspheric lens 98 into parallel beam 84.

The focal length of lens 98 is about 20 mm so that it creates a beam 84 with a diameter of about 5 mm. Divergence of this beam is about: where $\lambda$ is the 670 nm wavelength and D is the beam diameter of 5 mm, so the divergence is about $\theta=1.63\times10^{-4}$ radian. This low divergence beam is focused by lens 88 onto diode array 90 at a distance of about 500 mm. The spot size at the PDA is about 82 micron. The preferred PDA has 2048 pixels at 14 micron spacings. Thus the spot covers about 6 pixels.

Laser operators desire to control the laser to a desired wavelength with an accuracy of ±0.1 pm or better. A wavelength change of one picometer for a KrF laser corresponds to a change in the pivotable position of mirror 14 of about 9.9 μrad.

The distance between mirror 14 and PDA 90 is about 300 mm. A 9.9 μrad tilt of mirror 14 will produce a 5.94 micron shift in the beam spot on PDA 90. The spot thickness is about 82 microns. To try to achieve an accuracy of 0.6 μshift (correspondingly to 0.1 pm wavelength shift) will require monitoring the intensity values of pixels along the steep part of the beam spot (near the half maximum part of the spot). Processor 92 is preferably programmed to do that. Each pixel has an intensity response of 256 levels on commercially available low cost PDA arrays. Accuracy may also be improved by using averages of several pixels on the steep part of the spot and further improved by averaging a large number of intensity values over available time intervals.

Another preferred approach is indicated by FIG. 11A. Here an intermediate fixed mirror 100 permits the beam to make four bounces off mirror 14C which multiplies the shift by a factor of 4 to 24 microns shift per picometer wavelength. Thus, a 0.1 pm variation would correspond to a shift in the beam spot of 2.4 microns which would be much easier to see in the change in pixel intensity values on the steep edge of the spot.

Chirp

The change in wavelength with time is referred to in the industry as "chirp" or "wavelength chirp". These changes may occur very rapidly such as on time scales of 0.001 second or less. As indicated above, chirp can be caused by many factors such as thermal effects and acoustic effects in the chamber and optical elements. Mostly chirp is undesirable and the very fast control of wavelength provided by the present invention permit it to be used to minimize the chirp. In addition, there may be situations when some controlled chirp is desirable and it can be programmed in using computer controller 24A and processor 92. The main advantage of the system shown in FIGS. 11, 11A and 11B is that the mirror position can be set in advance of laser operation based on historical calibration data.

The reader should understand that in a gas discharge laser operating of pulse rates of 1000 Hz to 5000 Hz, the laser gas is circulating at speeds of up to 100 m/s between the electrodes which are periodically dumping about 3 kilowatts into a small quantity of laser gas, and the prisms and other optical components are being subject to ultraviolet light pulses with average energies varying from zero watts to about 50 watts. Thus, thermal and other effects can cause very slight changes in the wavelength which the operator may be attempting to conrol to an accuracy of 0.1 pm or less. The embodiment shown in FIG. 11 permits the operator to adjust tuning mirror 146 to compensate for distortions in the wavelength caused by these effects.

If an undesirable chirp pattern is detected corresponding to a particular mode of laser operation, the computer processors 24A and 92 can be programmed to control the tuning mirror 14C in advance to minimize the chirp.

Deformable Mirror

Figure 10:
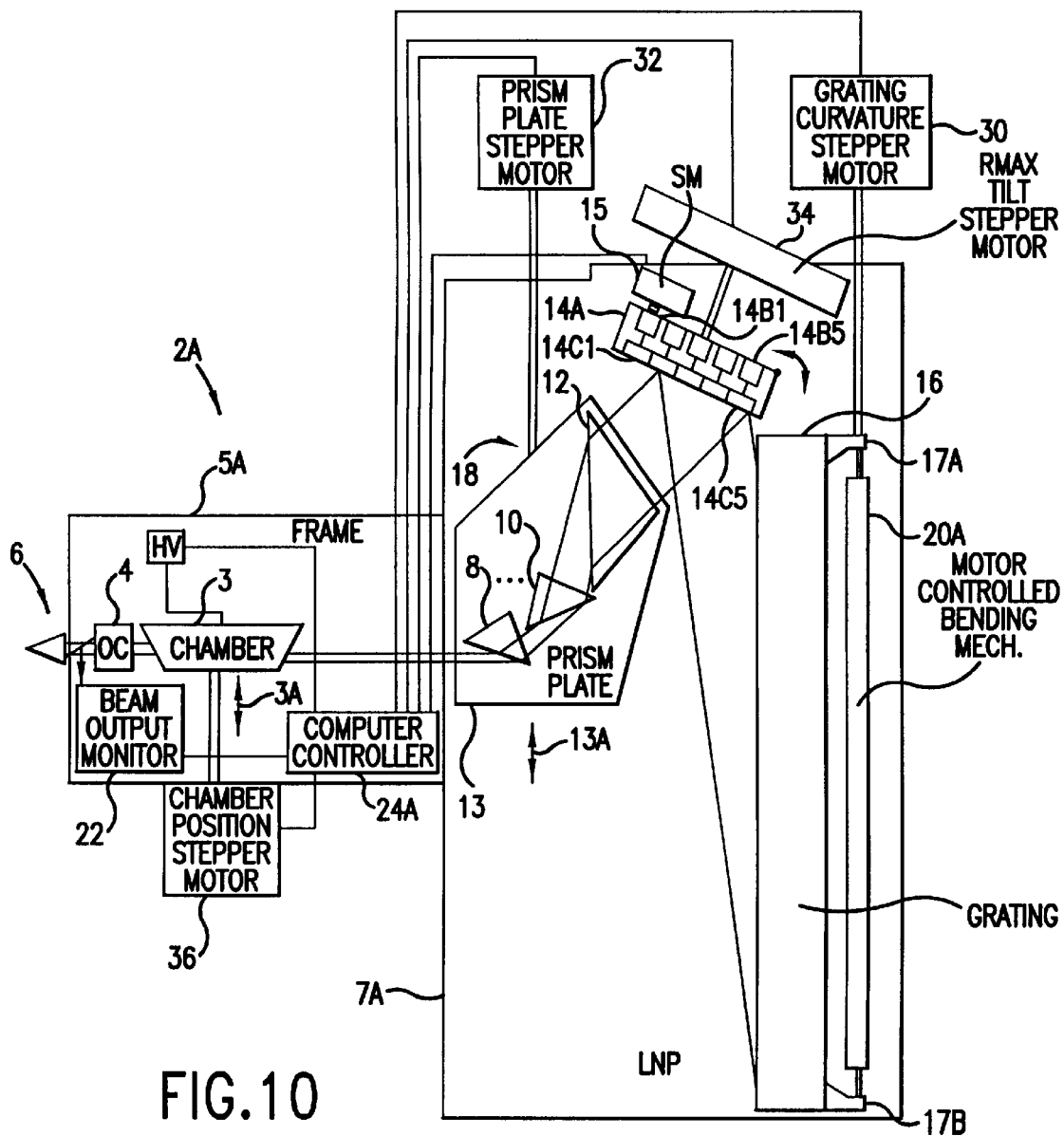
FIG. 10 shows an embodiment with a segmented $R_{MAX}$.

FIG. 10 shows another preferred embodiment of the present invention. In this case the embodiment is similar to the FIGS. 9 and 11 embodiments except that the mirror 14C in the FIGS. 9 and 11 embodiments is segmented into five segments 14C 1, 2, 3, 4 and 5. Each segment is controlled by its own piezo-electric driver. Preferably the piezo-electric elements provide tilt, tip and piston so that the mirrors can be pointed at the required angle and also if the mirrors are offset phase-wise that the offset is multiples of wavelengths. Such a segmented mirror is described in U.S. Pat. No. 4,944,580 issued Jul. 31, 1990, which is incorporated herein by reference. Because the individual segmented mirrors are much lighter much faster control as possible. Current piezo-electric technology permit pivotable adjustments at the rates up to 10,000 Hz.

Figure 10A:
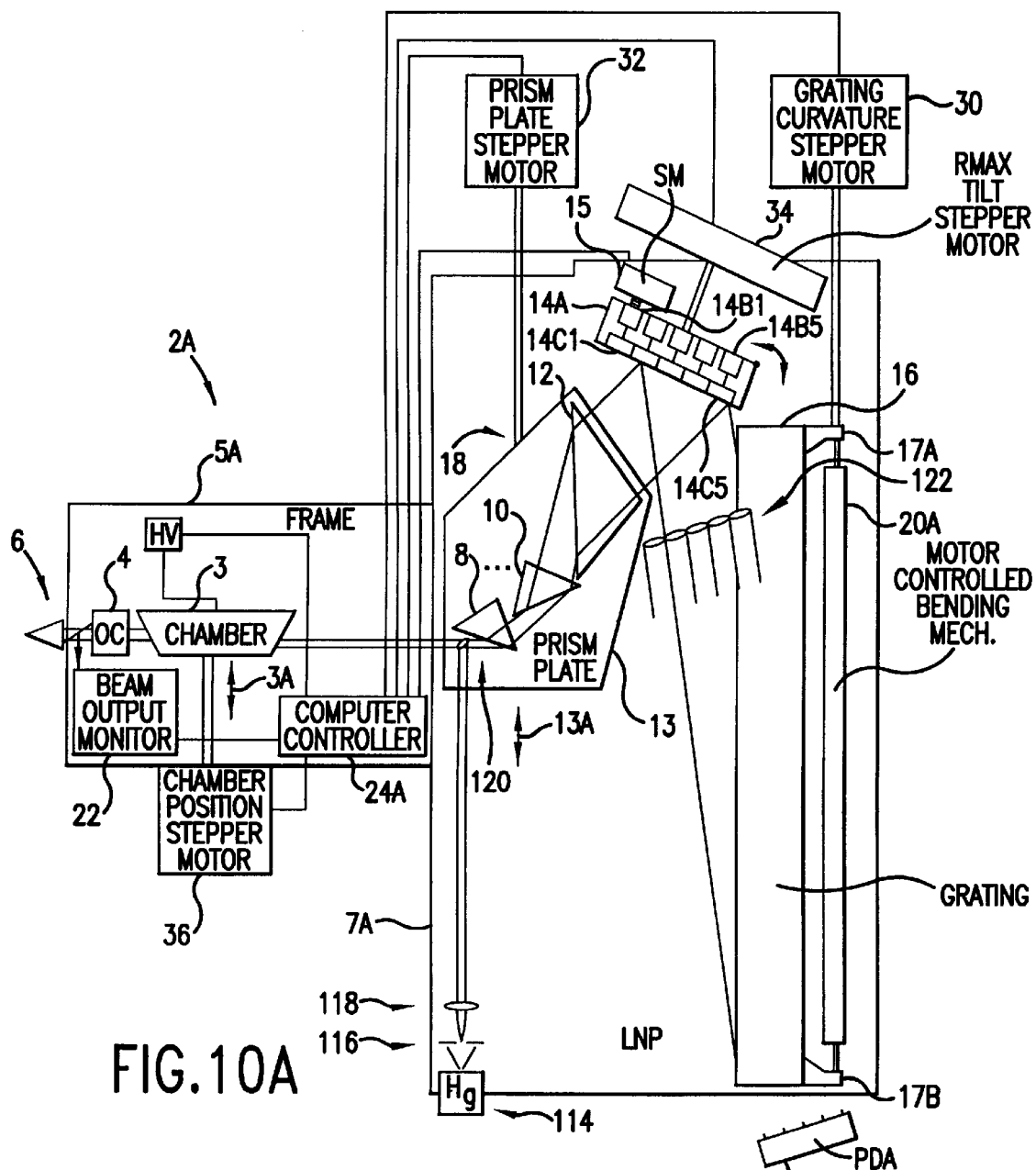

As shown in FIG. 10A the position of these mirrors can be monitored using a mercury light source from lamp 114 through slit 116 which is collimated with lens 118 and reflected off mirror 120 positioned above the laser beam. The Hg beam is expanded through beam expander prisms 8, 10 and 12 and focused by mirror array 122 onto PDA array 124.

Piezo-electric driven deformable mirrors of the type shown in FIG. 10 are available from many suppliers such as ThermoTrex Corporation, San Diego, Calif.

Pressure Modulation

Another method of providing very fine tuning of wavelength is by controlling the gas pressure in the LNP. The LNP is preferably purged with nitrogen. In the past the nitrogen pressure has been maintained constant at a pressure very slightly in excess of atmospheric pressure. A change in the nitrogen pressure changes the index of refraction of which changes very slightly the incident angle on the grating.

Figure 12:
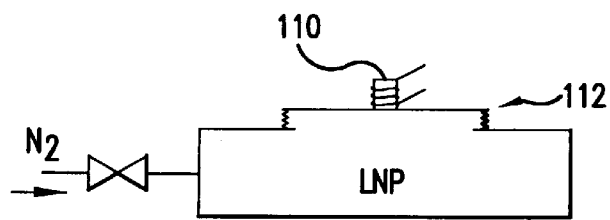
FIG. 12 show pressure controlled LNP.

Since the purge flow is a continuous flow through the LNP, the pressure could be changed using a control valve on the inlet purge line or on an outlet purge line. The resulting response would be relatively slow. Rapid changes in pressure could be provided as shown in FIG. 12 using a proportional solenoid actuator 110 and a bellows 112. Other purge gases such as helium could be used instead of nitrogen.

Although this invention has been disclosed and illustrated with reference to particular embodiments, the principals involved are susceptible for use in numerous other embodiments which will be apparent to persons skilled in the art. For example, each of the stepper motors could be replaced with alternative positioner units such as, ac or dc motors or hydraulic or pneumatic positioners. Many methods of controlling the positioners other than the suggested computer programs could be utilized. One or more stepper motors could be applied to the output coupler to automatically position it using similar techniques as described above for the $R_{MAX}$ mirror. Three strong permanent magnets could be used in the place of the two compression springs with one of the magnets replacing the piston as shown in FIG. 6. Magnet 60 is fixed to rod 4 and magnets 62 and 64 are fixed to housing 8. Rod 4 passes through holes in magnets 62 and 64. The effect of screwing rod 4 into and out of housing 8 is substantially the same as described above. The curvature of the grating could be accomplished using any of a large number of techniques. For example, compression or tension could be applied at a number of points to create virtually any shape desired and these shapes could be subject to feedback computer control. Mirror 14 could be other types of deformable mirrors such as smooth deformable mirrors. The beam expander could be an all reflective beam expander. The invention is therefore to be limited only as indicated by the scope of the appended claims and their legal equivalents.

We claim:

1. A narrow band electric discharge laser for producing an output laser beam, said laser comprising:
   A) a laser frame;
   B) a laser chamber adjustably mounted in said frame;
   C) a laser gas contained within said chamber;
   D) two elongated spaced apart electrodes contained within said chamber, said electrodes and laser gas between them defining a gain medium;
   E) a line narrowing module comprising a beam expander, a tuning mirror, and a grating, said line narrowing module and an output coupler defining a resonance cavity;
   F) a wavemeter for detecting laser output beam wavelength;
   G) a fine tuning means for adjusting said output wavelength with a precision of less than 0.1 pm; and
   H) a computer controller.

2. The laser as in claim 1 wherein said tuning means comprises at least one piezo-electric actuator for pivoting said tuning mirror.

3. The laser as in claim 1 wherein said tuning means comprises a pressure control means for increasing or decreasing gas pressure in said line narrowing module.

4. The laser as in claim 1 wherein said tuning means comprises a stepper motor and at least one piezo-electric actuator.

5. The laser as in claim 1 wherein said tuning mirror is a deformable mirror.

6. The laser as in claim 1 wherein said tuning mirror is a segmented mirror comprising a plurality of mirror segments.

7. The laser as in claim 1 and further comprising a mirror position detection system for detecting pivot positions of said tuning mirror.

8. The laser as in claim 7 wherein said mirror position detection system comprises a position detection light source directed at said mirror and a detector array for detecting reflection from said mirror.

9. The laser as in claim 8 wherein said light source comprises a diode laser.

10. The laser as in claim 8 wherein said light source comprises a mercury lamp.

11. The laser as in claim 6 and further comprising a mirror position detection system for detecting positions of each mirror segment.

12. The laser as in claim 1 and further comprising a chamber positioner unit for positioning said chamber in a horizontal direction so that said gain medium is in a desired position with respect to the resonance cavity.

13. The laser as in claim 12 wherein the computer controller is programmed to control said chamber positioner unit to position said chamber based on feedback information from said wavemeter.

14. The laser as in claim 1 wherein said prism beam expander comprises a plurality of prisms disposed on a prism plate, and further comprising a prism plate positioner unit for positioning said prism plate.

15. The laser as in claim 14 wherein said computer controller is programmed to control said prism plate positioner unit to position said prism plate based on feedback information from said wavemeter.

16. The laser as in claim 1 and further comprising an $R_{MAX}$ tilt positioner to tilt said $R_{MAX}$ mirror to control vertical spatial parameters of said output laser beam.

17. The laser as in claim 16 wherein said computer controller is programmed to control said tilt positioner to tilt said $R_{MAX}$ mirror based on beam information from said wavemeter.

18. The laser as in claim 1 wherein said beam expander comprises a plurality of prisms disposed on a movable prism plate and further comprising:

A) a chamber positioner unit for positioning said chamber in a horizontal direction upon control signals from said computer controller;

B) a prism plate positioning unit for positioning said prism plate upon control signals from said computer controller;

C) an $R_{MAX}$ tilt positioner to tilt said mirror based upon control signals from said computer controller; and D) an $R_{MAX}$ pivot positioner to pivot said mirror to adjust nominal wavelength of said output beam based on control signals from said computer controller.

19. The laser as in claim 1 further comprising a grating curvature positioner comprises a stepper motor.

* * * * *

UNITED STATES PATENT AND TRADEMARK OFFICE
CERTIFICATE OF CORRECTION

PATENT NO. : 6,192,064 B1
DATED : February 20, 2001
INVENTOR(S) : John M. Algots et al.

It is certified that error appears in the above-identified patent and that said Letters Patent is hereby corrected as shown below:

<u>Column 4,</u>
Line 30, delete "drawing 5A" and insert -- drawing 5 --.

Signed and Sealed this

Nineteenth Day of March, 2002

Attest:

JAMES E. ROGAN
*Director of the United States Patent and Trademark Office*

*Attesting Officer*